US006772940B2

(12) United States Patent
Schirmer

(10) Patent No.: US 6,772,940 B2
(45) Date of Patent: Aug. 10, 2004

(54) MAGNETIC RESONANCE IMAGING WITH REAL-TIME SNR MEASUREMENT

(75) Inventor: Timo Schirmer, Munich (DE)

(73) Assignee: GE Medical Systems Global Technology Company LLC, Waukesha, WI (US)

( * ) Notice: Subject to any disclaimer, the term of this patent is extended or adjusted under 35 U.S.C. 154(b) by 28 days.

(21) Appl. No.: 10/064,447

(22) Filed: Jul. 15, 2002

(65) Prior Publication Data

US 2004/0008029 A1 Jan. 15, 2004

(51) Int. Cl.[7] .................................................. G01V 3/00
(52) U.S. Cl. ..................................... 234/307; 324/309
(58) Field of Search ................................ 324/307, 309, 324/311, 314; 600/427; 128/202

(56) References Cited

U.S. PATENT DOCUMENTS 6,396,270 B1 * 5/2002 Smith ......................... 324/309
6,597,939 B1 * 7/2003 Lampotang et al. ........ 600/427
2002/0163334 A1 * 11/2002 Hagiwara ................... 324/303
2003/0088174 A1 * 5/2003 Sussman et al. ............ 324/309

OTHER PUBLICATIONS

Macovski et al Measurement– Dependent Filtering: A novel Approach to Improved SNR, IEEE Transections on Medical Imagin vol. MI–2 NO. 3, Sep. 1983.*
Kaufman et al. Measuring Signal–to–Noise Ratioes in MR Imaging: Radiology vol. 173, p. 265–267, 1989.*

* cited by examiner

Primary Examiner—Brij B. Shrivastav

(57) ABSTRACT

An apparatus for calculating the real-time SNR of a magnetic resonance imaging system 10 is provided, including an image processing engine 16 in communication with the magnetic resonance imaging system 14, said image processing engine 16 calculating an acquired real-time signal-to-noise ratio 54 for each of a plurality of real-time images 18 received from the magnetic resonance imaging system 14 and comparing said acquired real-time signal-to-noise ratios 54 with a reference signal-to-noise ratio to develop a relative signal-to-noise variance 26, and an audio feedback device 24 broadcasting an audio signal in response to said relative SNR variance 26.

20 Claims, 3 Drawing Sheets

MAGNETIC RESONANCE IMAGING WITH REAL-TIME SNR MEASUREMENT

BACKGROUND OF INVENTION

The present invention relates generally to a method and apparatus for measuring the SNR during magnetic resonance imaging, and more particularly, to a method and apparatus for real-time SNR measurement during magnetic resonance imaging.

The use of magnetic resonance imaging has expanded from simple diagnostic imaging into the field of guided surgical imaging. The development of a variety of open magnetic resonance imaging (MRI) systems has facilitated such usages and has resulted in an increase in MR guided surgical interventions. Despite the recent improvements in MR instrumentation, interventional MR imaging often still suffers from low signal-to-noise ratios (SNR) during some interventional procedures. Open MRI systems can be particularly susceptible to such low SNRs.

A good portion of the SNR restrictions are often related to the MR system specifications. These portions can often only be improved by a redesign of the MR system. Often this is not a practical solution. Existing MR systems can represent a significant investment of capital and therefore may not be slated for replacement or reconfiguration for some time. Additionally, design and manufacturing timelines may represent a considerable hurdle for implementation of improvements to the MR instrumentation. Again, while such design improvements are desirable and undoubtedly eventual, an approach to improving SNR that can be implemented on existing systems would be highly valuable.

Although a large portion of the SNR restrictions may be related to the MR system design, the SNR can be significantly influenced by instruments and monitoring devices used during surgery. Anesthesia devices, heart-rate monitors, and a wide variety of other electronic devices can generate noise during operation. The noise emitted by these devices can often be reduced by minor modifications of the surgical setup, such as repositioning devices or cables. Although such repositioning can produce significant improvements to the SNR, the amount of time available for such reconfigurations of the surgical environment is often quite limited before and during surgery. Localized sources of noise must often be quickly identified and repositioned to a desirable position. An immediate, fast, and interactive method of monitoring the effects of changes to the surgical environment would therefore be highly desirable. An effective way of communicating such changes to staff within the surgical environment would also be desirable.

SUMMARY OF INVENTION

It is, therefore, an object of the present invention to provide an apparatus and method for measuring the SNR during magnetic resonance imaging. It is a further object of the present invention to provide an apparatus and method quickly and simply improving the SNR during magnetic resonance imaging through the use of audio/visual indicators. In accordance with the objects of the present invention, an apparatus for measuring real-time SNR during magnetic resonance imaging is provided. The apparatus includes an image processing engine in communication with a magnetic resonance imaging system. The image processing engine calculates an acquired real-time signal-to-noise ratio based on a real-time image received from the MRI system and compares the acquired real-time SNR to a reference SNR to develop a relative SNR variance. The apparatus further includes an audio output device. The audio output device broadcasts a signal in response to the relative SNR variance.

Other objects and features of the present invention will become apparent when viewed in light of the detailed description of the preferred embodiment when taken in conjunction with the attached drawings and appended claims.

DETAILED DESCRIPTION

Figure 1:
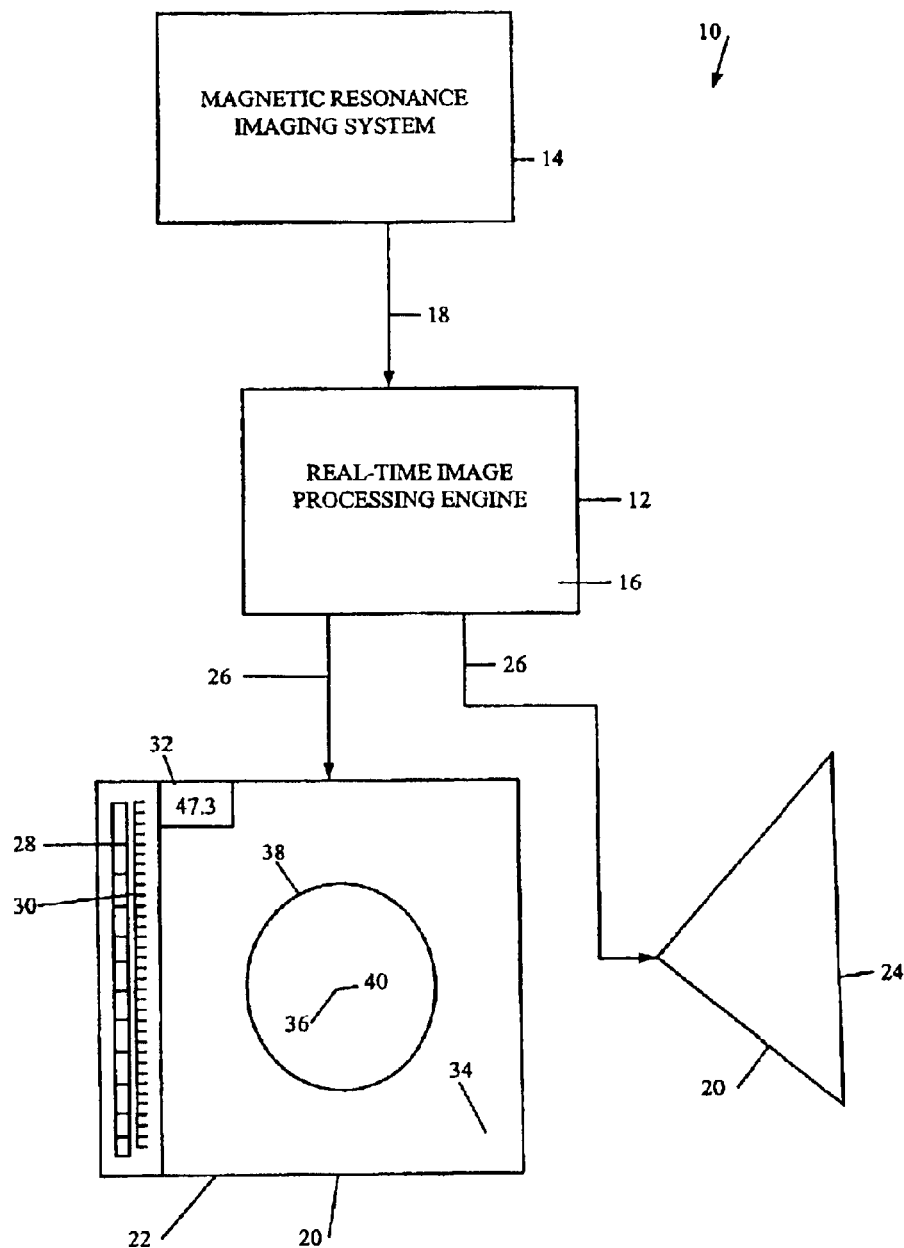
FIG. 1 is an illustration of an embodiment of an apparatus for measuring real-time SNR during magnetic resonance imaging.

Referring now to FIG. 1, which is an illustration of an apparatus for measuring real-time SNR during magnetic resonance imaging 10. The apparatus includes a real-time image processor 12 in communication with a magnetic resonance imaging system 14. Although the present invention was developed for use with a 0.5T open MRI scanner, it should be understood that it is applicable for use with a wide variety of magnetic resonance imaging systems 14 including both open and closed systems.

The real-time image processor 12 includes an image processing engine 16 utilized to process real-time images 18 received from the magnetic resonance imaging system 14. The imaging processing engine 16 calculates changes in the signal-to-noise ratio 26 of the incoming real-time images 18. These changes are then communicated to operators of the magnetic resonance imaging system 14 through the use of at least one media device 20 in communication with the real-time image processor 12. Although a variety of media devices 20 are contemplated by the present invention, two of the most significant media devices 20 contemplated are a visual display 22 and an audio feedback device 24. Both of these media devices 20 can be utilized either alone or in combination with one another and carry with them inherent benefits. The use of a visual display 22 allows for the communication of precise changes in the SNR ratio in combination with a visualization of the incoming real-time images 18. The communication can take the form of a variety of standard devices such as a bar graph 28, a scale 30, or a printed value 32. The audio feedback device 24, such as active loudspeakers, can provide operators with immediate information regarding changes in the SNR without distracting them from the tasks at hand or requiring their attention to be pulled to a video display 22.

Figure 2:
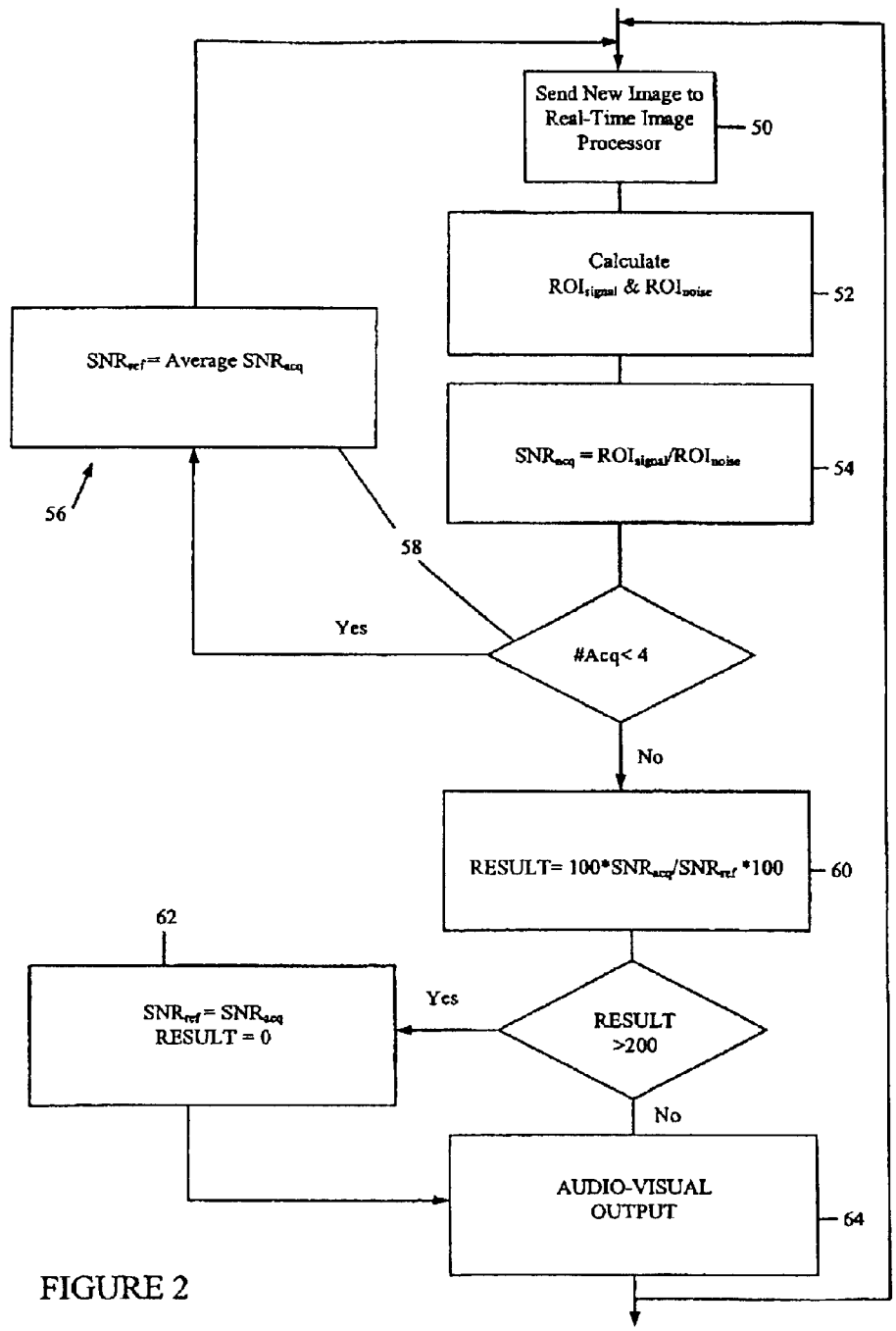
FIG. 2 is a detailed flow diagram illustrating an embodiment of a method for measuring real-time SNR during magnetic resonance imaging in accordance with the present invention.

Although it is contemplated that the image processing engine 16 may function in a variety of fashions, one embodiment is illustrated in FIG. 2. Successful execution of the image processing engine 16 requires the definition of two regions of interest, a of interest placed in an area of pure noise ($ROI_{noise}$ 34), and a second in an area of signal ($ROI_{signal}$ 36). These regions 34,36 can be defined using a variety of signal methodologies. One contemplated methodology utilizes magnitude images to define the regions of interest 34,36. Other contemplated methodologies can utilize complex raw data to determine noise using an average of pixel intensities at the edge of the k-space 38 while peak signal can be found in the center of k-space 40. Although two methodologies have been described, it should be understood that a wide variety of such methodologies are contemplated by the present invention.

When an incoming real-time image 18 is acquired it is sent to the real-time image processor 50. The average signal is calculated by the image processing engine 16 and the engine calculates values for the $ROI_{signal}$ and the $ROI_{noise}$ 52. An acquired SNR is estimated base upon the equation $SNR_{acq}=ROI_{signal}/ROI_{noise}$ 54. The method can further include the step of calculating a referenced SNR 56. Although this may be accomplished in a variety of fashions, one embodiment averages the first three $SNR_{acq}$ to create the $SNR_{ref}$ 58. Other embodiments, however, may utilized alternate methods for calculating the $SNR_{ref}$ or may use predetermined values for the $SNR_{ref}$. Once a $SNR_{ref}$ and a $SNR_{acq}$ are calculated, a relative SNR variance can be calculated 60. Again, although a variety of calculations can be used to calculated the SNR variance, one embodiment contemplates the use of the equation $SNR_{var}=100*SNR_{acq}/SNR_{ref}-100$. It is also contemplated that the SNRref may be recalculated if and when the $SNR_{var}$ improves beyond a certain threshold 62. One contemplated embodiment sets the threshold at 200% and sets the $SNR_{ref}$ to the $SNR_{acq}$ if this threshold is met. The results of the $SNR_{var}$ are then communicated to a media device, such as an audio-visual device, for output 64.

Figure 3:
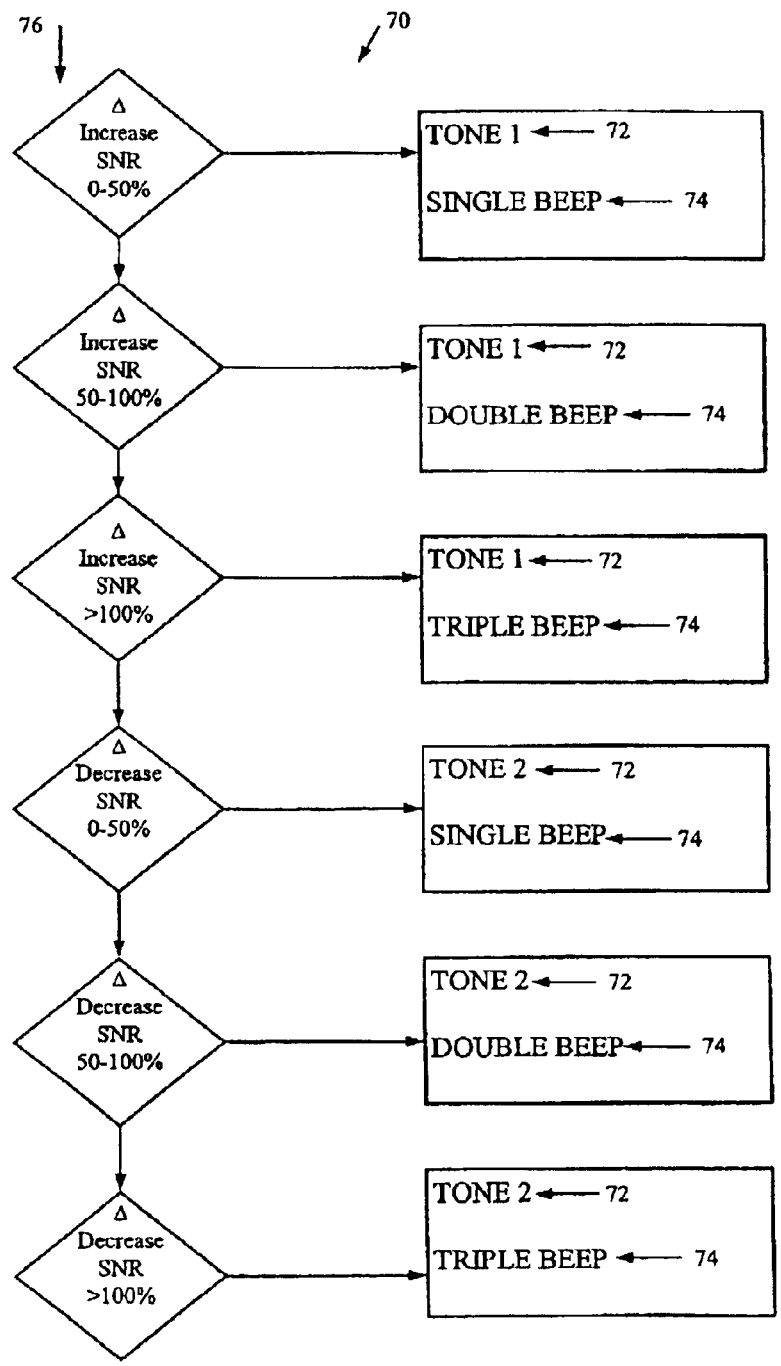
FIG. 3 is a detail of a flow diagram illustrating an embodiment of an audio scheme for use in an apparatus as described in claim 1.

The results can be displayed/conveyed by the media device in a plurality of fashions. One particular embodiment contemplates displayed the results on a color coded scale of 20% to 200%. It is further contemplated that the operator may be notified in a command window if the $SNR_{ref}$ value was reset. Similarly, the present invention contemplates the use of a wide variety of audio-schemes 70 that can be used with the present invention. One example of an audio-scheme 70 is illustrated in FIG. 3. The use of audio schemes 70 can be used to allow operators to easily distinguish between increase and decrease of SNR even if mixed in with noise generated by the magnetic resonance imaging system 14. The assignment of a first tone for increase in SNR and a second tone for decrease in SNR 72 is one element of the proposed audio scheme 70. Increasing the number of beeps in relation to increased SNR magnitude 74 is a second element. It should be understood that although the delta SNR 76 utilized for the audio-scheme 70 may simply be based upon the $SNR_{var}$, it may be based upon values other than the $SNR_{ref}$. In one embodiment $SNR_{delta}=100*SNR_{acq(x+1)}/SNR_{acq(x)}$. In this embodiment, the audio-scheme 70 can respond to SNR changes between corresponding image frames rather than based upon an $SNR_{ref}$.

While particular embodiments of the invention have been shown and described, numerous variations and alternative embodiments will occur to those skilled in the art. Accordingly, it is intended that the invention be limited only in terms of the appended claims.

What is claimed is:

1. A method of measuring and reporting real-time SNR measurements during magnetic resonance imaging comprising:
    receiving a real time image from a magnetic resonance imaging system;
    calculating an acquired signal-to-noise ratio based upon said real time image;
    calculating a relative SNR variant based upon said acquired signal-to-noise ratio; and
    communicating said relative SNR variant through the use of a media device.

2. A method as described in claim 1, further comprising:
    calculating a reference SNR, said relative SNR variant based upon said acquired SNR divided by said reference SNR.

3. A method as described in claim 2, wherein said reference SNR is based upon the average of a plurality of said acquired SNRs.

4. A method as described in claim 2, wherein said reference SNR is recalculated when said relative SNR variant exceeds a preset threshold.

5. A method as described in claim 2, wherein said reference SNR is reset to said acquired SNR when said relative SNR variant exceeds a preset threshold.

6. A method as described in claim 1, wherein said media device comprises a visual display.

7. A method as described in claim 1, wherein said media device comprises an audio feedback device.

8. A method as described in claim 7, wherein said audio feedback device operates under an audio scheme based upon changes in said acquire signal-to-noise ratio.

9. A method as described in claim 8, wherein said audio scheme varies a tone based upon the increase or decrease of said acquired signal-to-noise ratio.

10. A method of measuring and reporting real-time SNR measurements during magnetic resonance imaging comprising:
    receiving a real time image from a magnetic resonance imaging system;
    calculating an acquired signal-to-noise ratio based upon said real time image;
    calculating a relative SNR variant based upon said acquired signal-to-noise ratio;
    communicating said relative SNR variant through the use of a media device; and
    calculating a noise region-of-interest and a signal region-of-interest, said acquired signal-to-noise ratio equal to said signal region-of-interest divided by said noise region-of-interest.

11. A method as described in claim 10, wherein said noise region-of-interest and said signal region-of-interest are calculated using one of the group of magnitude images or complex image data.

12. A method as described in claim 10, wherein said noise region-of-interest and said signal region-of-interest are calculated using k-space pixilization.

13. A method of measuring and reporting real-time SNR measurements during magnetic resonance imaging comprising:
    receiving a plurality of real time images from a magnetic resonance imaging system;
    calculating an acquired signal-to-noise ratio based upon each of said real lime images;
    calculating a reference SNR based upon a plurality of said acquired signal-to-noise ratios;
    calculating a relative SNR variant based upon said acquired signal-to-noise ratio; and
    communicating said relative SNR variant through the use of a audio feedback device.

14. A method as described in claim 13, wherein said audio scheme indicates and increase or decrease in the acquired SNR.

15. A method as described in claim 14, wherein said increase or said decrease is indicated by a change in tone.

16. A method as described in claim 13, wherein said audio scheme indicate the magnitude of change of said acquired SNR through the use of multiple beeps.

17. A method as described in claim 13, wherein said relative SNR variant is based upon said acquired signal-to-noise ratio divided by said reference signal-to-noise ratio.

18. A method as described in claim 13, wherein said relative SNR variant is based upon consecutive of said acquired signal-to-noise ratios.

19. An apparatus for calculating the real-time SNR of a magnetic resonance imaging system comprising:

an image processing engine in communication with the magnetic resonance imaging system, said image processing engine calculating an acquired real-time signal-to-noise ration for each of a plurality of real-time images received from the magnetic resonance imaging system and comparing said acquired real-time signal-to-noise ratios with a reference signal-to-noise ratio to develop a relative signal-to-noise variance; and an audio feedback device broadcasting an audio signal in response to said relative SNR variance.

20. An apparatus as described in claim 19, further comprising:

a visual display in communication with said image processing engine, said visual display providing visual output in response to said relative SNR variance.

* * * * *